United States Patent
Nale

(10) Patent No.: US 10,199,084 B2
(45) Date of Patent: Feb. 5, 2019

(54) TECHNIQUES TO USE CHIP SELECT SIGNALS FOR A DUAL IN-LINE MEMORY MODULE

(71) Applicant: Intel Corporation, Santa Clara, CA (US)

(72) Inventor: Bill Nale, Livermore, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/197,424

(22) Filed: Jun. 29, 2016

(65) Prior Publication Data

US 2017/0278562 A1  Sep. 28, 2017

Related U.S. Application Data

(60) Provisional application No. 62/314,061, filed on Mar. 28, 2016.

(51) Int. Cl.
*G11C 11/406* (2006.01)
*G11C 7/10* (2006.01)
*G06F 12/00* (2006.01)

(52) U.S. Cl.
CPC ...... *G11C 11/40618* (2013.01); *G11C 7/1072* (2013.01)

(58) Field of Classification Search
None
See application file for complete search history.

(56) References Cited

U.S. PATENT DOCUMENTS

| | | | |
|---|---|---|---|
| 8,539,145 B1 | 9/2013 | Warnes et al. | |
| 2006/0106951 A1* | 5/2006 | Bains | G06F 13/4086 710/5 |
| 2006/0262586 A1* | 11/2006 | Solomon | G06F 12/0207 365/63 |
| 2007/0147106 A1* | 6/2007 | Kyung | G11C 7/1072 365/148 |
| 2010/0070690 A1* | 3/2010 | Amer | G11C 7/1051 711/103 |
| 2010/0138598 A1 | 6/2010 | LaBerge | |
| 2010/0165782 A1 | 7/2010 | Lee | |
| 2011/0082971 A1* | 4/2011 | Berke | G06F 13/1694 711/105 |
| 2011/0095783 A1* | 4/2011 | Ferolito | G06F 13/4086 326/30 |

(Continued)

FOREIGN PATENT DOCUMENTS

WO  2010144624 A1  12/2010

OTHER PUBLICATIONS

Jesd79c Double Data Rate (DDR) SDRAM Specification, 2003 by Jedec.*

(Continued)

*Primary Examiner* — Tuan V Thai
(74) *Attorney, Agent, or Firm* — Compass IP Law PC

(57) ABSTRACT

Examples may include techniques to use chip select signals for a dual in-line memory module (DIMM). In some examples, the chip select signals are used with either a first encoding scheme for clock enable (CKE) functionality or a second encoding scheme for on-die termination (ODT) functionality to enable memory devices on the DIMM to be accessed or controlled according to commands received with the chip select signals.

28 Claims, 7 Drawing Sheets

(56) References Cited

U.S. PATENT DOCUMENTS

2014/0085999 A1     3/2014   Kang
2015/0331817 A1*   11/2015   Han ........................ G11C 5/04
                                                                                                  710/308

OTHER PUBLICATIONS

International Search Report and Written Opinion for PCT Patent Application No. PCT/US2017/013661, dated Apr. 26, 2017, 13 pages.

* cited by examiner

500

RECEIVE, AT A REGISTER FOR A DIMM, A COMMAND TO ACCESS MEMORY DEVICES LOCATED AT THE DIMM OR LOCATED AT A SECOND DIMM, THE COMMAND RECEIVED VIA A CA SIGNAL
502

DETERMINE WHETHER ONE OR MORE CSs RECEIVED WITH THE CA SIGNAL ARE ACTIVE
504

DETERMINE WHETHER TO CAUSE ONE OR MORE CSs COUPLED BETWEEN THE REGISTER AND MEMORY DEVICES AT THE DIMM TO BE ACTIVATED AND OUTPUTTED FROM THE REGISTER BASED ON THE DETERMINATION OF WHETHER ONE OR MORE CSs RECEIVED WITH THE CA SIGNAL ARE ACTIVE AND BASED ON EITHER A FIRST ENCODING SCHEME FOR CKE FUNCTIONALITY OR BASED ON A SECOND ENCODING SCHEME FOR ODT FUNCTIONALITY
506

FIG. 5

Storage Medium 600

*Computer Executable Instructions for 500*

*FIG. 6* under US 10,199,084 B2

TECHNIQUES TO USE CHIP SELECT SIGNALS FOR A DUAL IN-LINE MEMORY MODULE

RELATED CASE

This application claims priority to U.S. Provisional Patent Application No. 62/314,061 filed on Mar. 28, 2016 that is hereby incorporated by reference in its entirety.

TECHNICAL FIELD

Examples described herein are generally related to dual in-line memory modules (DIMMs).

BACKGROUND

Computing platforms or systems such as those configured as a server may include dual in-line memory modules (DIMMs). DIMMs may include various types of memory including volatile or non-volatile types of memory. As memory technologies have advanced to include memory cells having higher and higher densities, memory capacities for DIMMs have also substantially increased. Also, advances in data rates for accessing data to be written to or read from memory included in a DIMM enable large amounts of data to flow between a requestor needing access and memory devices included in the DIMM.

BRIEF DESCRIPTION OF THE DRAWINGS

FIG. 5 illustrates an example logic flow.
FIG. 6 illustrates an example storage medium.

DETAILED DESCRIPTION

New technologies associated with DIMMs are being developed that include, but are not limited to, DDR5 (DDR version 5, currently in discussion by JEDEC), LPDDR5 (LPDDR version 5, currently in discussion by JEDEC), HBM2 (HBM version 2, currently in discussion by JEDEC), and/or other new technologies based on derivatives or extensions of such specifications. These new technologies such as DDR5 may have DIMM configurations that have a reduced number of pins compared to previous DDR technologies. For example, clock enable (CKE) and on-die termination (ODT) pins have been eliminated. Instead of pins, CKE and ODT functionality may be enabled via various encoding schemes.

Figure 1:
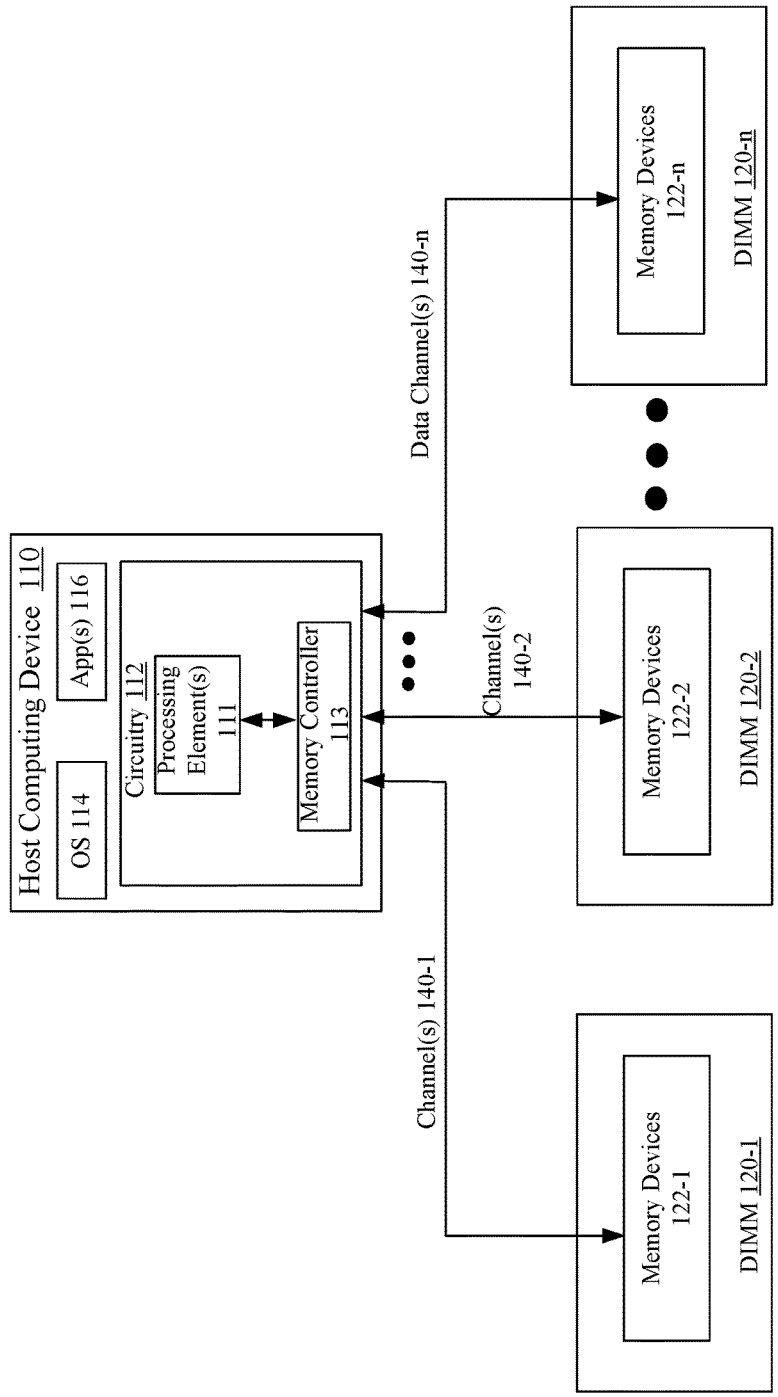
FIG. 1 illustrates an example system.

FIG. 1 illustrates a system 100. In some examples, as shown in FIG. 1, system 100 includes a host computing device 110 coupled to DIMMs 120-1 to 120-*n*, where "n" is any positive whole integer with a value greater than 2. For these examples, DIMMs 120-1 to 120-*n* may be coupled to host computing device 110 via one or more channels 140-1 to 140-*n*. As shown in FIG. 1, host computing device 110 may include an operating system (OS) 114 one or more applications (App(s)) 116 and circuitry 112. Circuitry 112 may include one or more processing element(s) 111 (e.g., processors or processor cores) coupled with a memory controller 113. Host computing device 110 may include, but is not limited to, a personal computer, a desktop computer, a laptop computer, a tablet, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

In some examples, as shown in FIG. 1, DIMMs 120-1 to 120-*n* may include respective memory dies or devices 122-1 to 122-*n*. Memory devices 122-1 to 122-*n* may include various types of volatile and/or non-volatile memory. Volatile memory may include, but is not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Non-volatile memory may include, but is not limited to, non-volatile types of memory such as 3-D cross-point memory that are byte or block addressable. These block addressable or byte addressable non-volatile types of memory for memory devices 122-1 to 122-*n* may include, but are not limited to, memory that uses chalcogenide phase change material (e.g., chalcogenide glass), multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM), memory that incorporates memristor technology (memristors), spin transfer torque MRAM (STT-MRAM), or a combination of any of the above, or other non-volatile memory types.

According to some examples, memory devices 122-1 to 122-*n* including volatile and/or non-volatile types of memory may operate in accordance with a number of memory technologies, such as the previously mentioned DDR5, LPDDR5 or HBM2, and/or other technologies based on derivatives or extensions of such specifications for these developing technologies. Memory devices 122-1 to 122-*n* may also operate in accordance with other memory technologies such as, but are not limited to, DDR4 (double data rate (DDR) version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), and/or other technologies based on derivatives or extensions of these specifications.

According to some examples, a DIMM such as a DIMM from DIMMs 120-1 to 120-*n* may be designed to function as a registered DIMM (RDIMM), a load reduced DIMM (LRDIMM), a fully-buffered DIMM (FB-DIMM), an unbuffered DIMM (UDIMM) or a small outline (SODIMM). Examples are not limited to only these DIMM designs.

In some examples, memory devices 122-1 to 122-*n* at DIMMs 120-1 to 120-*n* may include all or combinations of types of volatile or non-volatile memory. For example, memory devices 122-1 at DIMM 120-1 may include volatile memory (e.g., DRAM) on a front or first side and may include non-volatile memory (e.g., 3-D cross point memory) on a back or second side. In other examples, a hybrid DIMM may include combinations of non-volatile and volatile types of memory for memory devices 122-1 on either side of DIMM 120-1. In other examples, all memory devices 122-1 may be either volatile types of memory or non-volatile types of memory. In some examples, multiple channels may be coupled with memory devices maintained on a DIMM and in some examples, separate channels may be routed to different non-volatile/volatile types and/or groups of memory devices. For example, a first channel to memory devices including non-volatile memory and a second channel to memory devices including volatile memory. In other examples, a first channel may be routed to memory devices on a first side of a DIMMs and a second channel to memory devices on a second side of the DIMMs. Examples are not limited to the above examples of how multiple channels may be routed to memory devices included on a single DIMMs.

Figure 2:
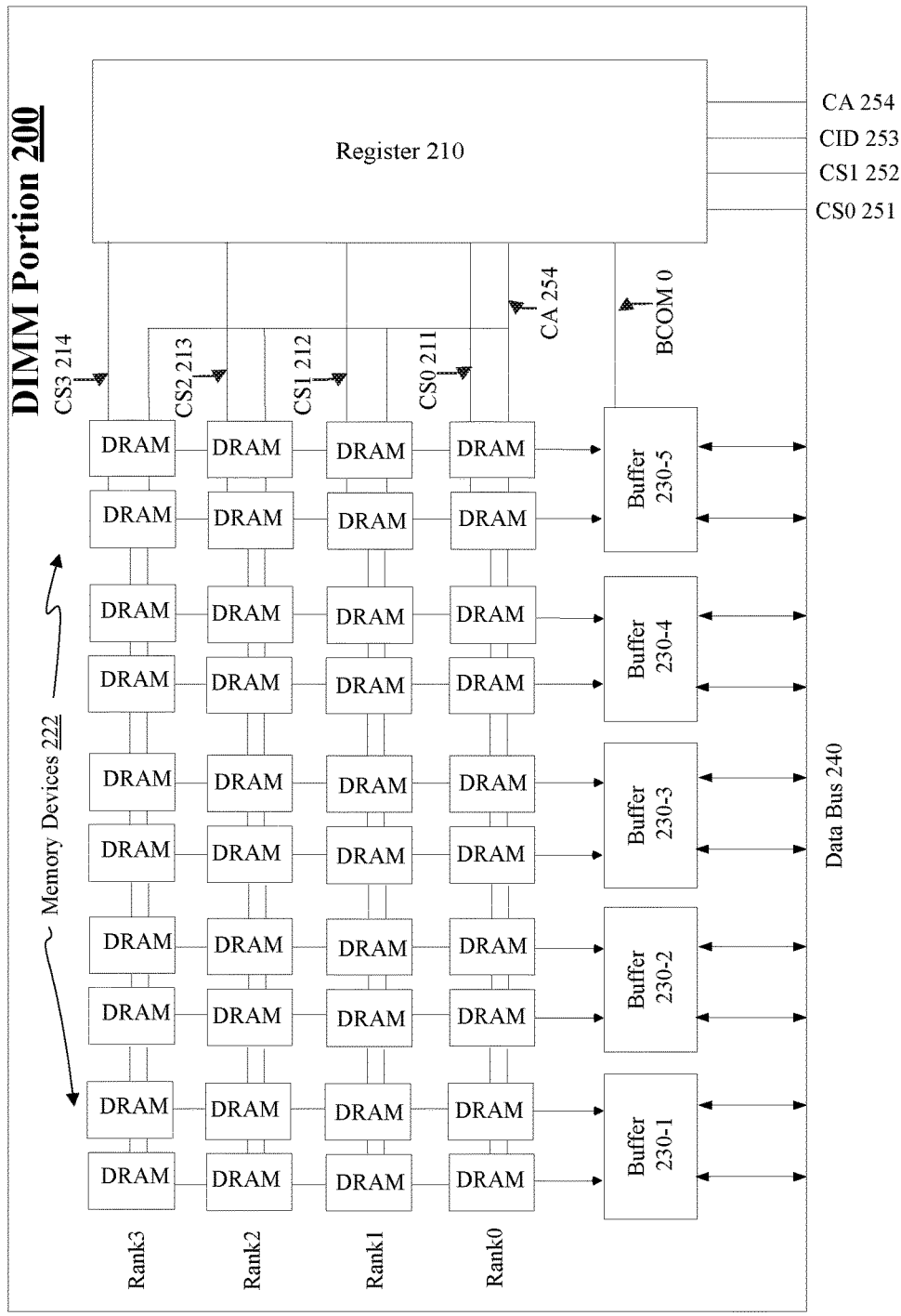
FIG. 2 illustrate an example portion of a dual in-line memory modules (DIMM).

FIG. 2 illustrates a DIMM portion 200. In some examples, DIMM portion 200 may be represent a first side of two sides of a DIMM arranged as an LRDIMM supported by a single register such as register 210. A full DIMM may include an equal number of memory devices 222 and buffers 230-1 to 230-5 on a second side or back side. Examples are not limited to DIMMs arranged in an LRDIMM configuration having buffers 230-1 to 230-5. In other examples, other types of DIMM configurations such as, but not limited to, an RDIMM configuration may be applicable.

According to some examples, buffers 230-1 to 230-5 may be data buffers controlled by logic and/or features of register 210 to route data associated with requests for access or control of memory devices 222 via a BCOM 0 bus based on commands received from a host computing device (not shown) responsive to various signals received from the host computing device. For these examples, at least a portion of the signals from the host computing device may be received by register 210 via chip select (CS) CS0 251, CS1 252, chip identification (CID) 253 or command/address (CA) 254. For these examples, each memory device included in memory devices 222 may be a DRAM memory device and may be coupled with respective buffers 330-1 to 330-5 via a 4 bit (b) data bus. Buffers 230-1 to 230-5 may transfer data to the host computing device via data bus 240 or may be caused to have internal resistance terminations (RTTs) when respective memory devices coupled to these buffers are not being accessed. Examples are not limited to DRAM memory devices or to a 4b data bus. Different memory devices having different sized data buses such as 8b are contemplated. Also, examples are not limited to ten memory devices per rank or to a total number of five buffers per side of a DIMM. Examples are also not limited to a DIMM having a total of 4 ranks. In some examples 2, 3 or more than 4 ranks are contemplated.

According to some examples, memory devices 222 may be arranged in multiple ranks shown in FIG. 2 as Rank0, Rank1, Rank2 or Rank3. Rank0, Rank1, Rank2 or Rank3 may be controlled or accessed based on respective active CSs outputted from register 210 via CS0 211, CS1 212, CS2 213 and CS3 214 as well as CA signals outputted from register 210 via CA 254. In some examples, register 210 may include logic and/or features to determine which ranks to access or control based on signals received via CS0 251, CS1 252, CID 253 or CA 254 from a host computing device (e.g., a host controller). Also, this logic may include CKE encoding to allow a broadcast of certain commands received from the host computing device (e.g., a power down command) to all ranks or may include ODT encoding for a DIMM to determine whether or not to terminate or cause RTTs on either a device or host side of data bus 240.

Figure 3:
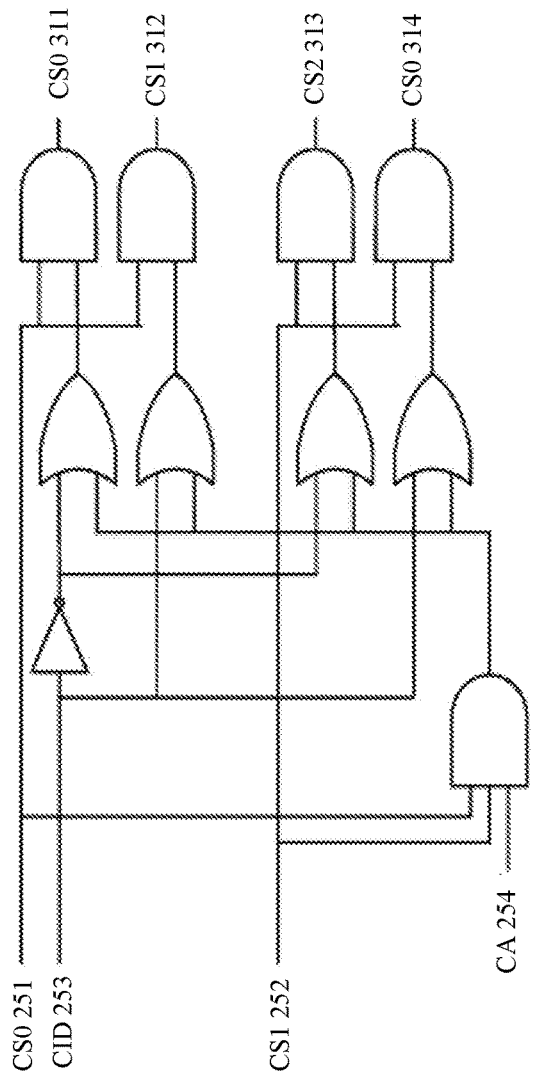
FIG. 3 illustrate an example memory device logic.

FIG. 3 illustrates an example memory device logic 300. In some examples, circuitry of memory device logic 300 may cause one or more active CSs to be outputted based on signals received via CS0 251, CS1 252, CID 253 or CA 254. As mentioned above for and shown in FIG. 2, these signals may be received by a register 210 for DIMM portion 200. Therefore, for these examples, memory device logic 300 may be part of logic and/or features included in a register for a DIMM.

According to some examples, as shown in FIG. 3, four different CSs may be activated based on signals received via CS0 251, CS1 252, CID 253 and CA 254. Activated CSs signals may be output via CS0 311, CS1 312, CS2 313 and/or CS3 314. For these examples, no output is shown for CA 254 from memory device logic 300. As described more below, CA 254 may be relevant to determinations made regarding the type of command (e.g., power down, self refresh, read, write, etc.) and the type of encoding related to the type of command (e.g., CKE functionality encoding or ODT functionality encoding). Although not shown in FIG. 3, input CA signals received via CA 254 may be forwarded to individual or all ranks in a DIMMs based on these determinations.

According to some examples for CKE functionality, a CKE encoding scheme may be enabled by memory device logic 300 to allow a broadcast of various types of commands where all ranks of a DIMM may be placed in a same mode of operation. For example, first types of commands that may be broadcasted may include power down entry and exit commands, second types of commands that may be broadcasted may include self refresh entry and exit commands and third types of commands that may be broadcasted may include ZQ calibration (Cal) commands. Examples are not limited to these three types of commands, other types of commands that may be broadcasted and to cause all ranks to be in a same mode of operation are contemplated by this disclosure.

In some examples, the CKE encoding scheme may include if only one of CS0 251 and CS1 252 are active (e.g., receive an input CS signal from the host computing device), the command received from a host computing device through CA signals via CA 254 may be for an individual or single rank as decoded by which CS received via CS0 251 or CS1 253 is active and a CID signal received via CID 253. For example, a CID encoding may indicate a state of a CID bit that includes a 1 bit value of "0" if no CID signal is received via CID 253 or a 1 bit value of "1" if a CID signal is received via CID 253. Table I below is an example CID encoding to determine which CS from among CS0 311, CS1 312, CS2 313 or CS3 314 is caused to be active. Note that for this example, only one active CS is outputted from a register including memory device logic 300. The active CS outputted from the register, for example, may enable access or control of memory devices included in a given rank (e.g., based on a command from a host computing device included in received CA signals). Also note that for FIG. 3 and Table I active CSs may be active high signals. Examples are not limited to active high signals. In other examples, active CSs may be indicated by active low signals.

TABLE I

| CID 253 | CS0 251 | CS1 252 | Output |
|---------|---------|---------|--------|
| 0 | 1 | 0 | CS0 311 |
| 1 | 1 | 0 | CS1 312 |
| 0 | 0 | 1 | CS2 313 |
| 1 | 0 | 1 | CS3 314 |

According to some examples, the CKE encoding scheme may also include if both CS0 251 and CS1 252 are active (e.g., receive an input CS signal from the host computing device). For these examples, a type of command arranged to be broadcast to all ranks (e.g., self refresh command) may be received from a host computing device through CA signals via CA 254. For these examples, a bit value derived from a state of a CID bit received via CID 253 is ignored and four active CSs are outputted via CS0 311, CS1 312, CS2 313 and CS3 314 from the register in order to access or control memory devices included in all four ranks according to the received command. As mentioned previously, examples are not limited to DIMMs having 4 ranks. For example, a DIMM having 2 ranks may not require the use of Table I for CID encoding as CS0 251 and CS1 252 may be used to determine which CS to output to the 2 ranks (e.g., CS0 311 or CS1 312). For this example, the CKE encoding scheme may still be implemented to broadcast to a single or both ranks with a need for CID encoding.

In some examples for ODT functionality, an ODT encoding scheme may be enabled by memory device logic 300 via use of active CSs received via CS0 251 and/or CS1 252, further decoded with a CID signal received via CID 253 according to the CID encoding shown in Table I. ODT functionality, for example, may be implemented upon receipt of read or write commands.

According to some examples, an ODT function on read and write commands received from a host computing device through CA signals via CA 254 may be implemented based on which active CS from among CS0 311, CS1 312, CS2 313 and CS3 314 is outputted from the register based on the CID encoding shown in Table I above. For these examples, the ODT function may be determined based on two command or clock cycles for CA signals received via CA 254. Table II indicates an ODT encoding scheme enabled by memory device logic 300 to determine what ODT function applies or is to be implemented. The ODT functions in Table II may be for various RTTs to be carried out by memory devices for a given rank or in the case of a read command, the targeted rank's ODT function may be to drive data onto a data bus.

TABLE II

| 1st Cycle Active | 2nd Cycle Active | Target | Command | ODT Function |
|---|---|---|---|---|
| No | No | No | N/A | RTT_Park |
| Yes | Yes | No | Read | RTT_NOM_RD |
| Yes | Yes | No | Write | RTT_NOM_WR |
| Yes | No | Yes | Read | Drive data |
| Yes | No | Yes | Write | RTT_WR |
| No | Yes | No | N/A | Illegal - N/A |

According to some examples, an ODT function based on the ODT encoding scheme shown in Table II may include if only one of CS0 251 and CS1 252 is active (e.g., receive an input CS signal from the host computing device) for a first clock cycle, but not active for a second clock cycle: the DIMM including memory device logic 300 is a target of a memory device access (e.g., read/write command), with a rank decoded based on the CID encoding shown in Table I to determine which active CS from among CS0 311, CS1 312, CS2 313 and CS3 314 may be outputted from the register to memory devices included in the rank to execute the command. For these examples, logic and/or features at a register for the DIMM may use a first lookup table to determine which ranks of the memory devices are non-target ranks needing RTT or termination consistent with a given ODT function according to Table II. An example first lookup table is shown below in Table III.

As mentioned previously, examples are not limited to DIMMs having 4 ranks. For example, a DIMM having 2 ranks may not require the use of Table I for CID encoding as CS0 251 and CS1 252 may be used to determine which CS to output to the 2 ranks (e.g., CS0 311 or CS1 312). For this example, the Table II ODT encoding scheme may still be used to determine which ODT function applies.

TABLE III

| | | Ranks Which Terminate | | | |
|---|---|---|---|---|---|
| Target | Read/Write | 3 | 2 | 1 | 0 |
| Rank0 | Read | 0/1 | 0/1 | 0/1 | X |
| Rank1 | Read | 0/1 | 0/1 | X | 0/1 |
| Rank2 | Read | 0/1 | X | 0/1 | 0/1 |
| Rank3 | Read | X | 0/1 | 0/1 | 0/1 |
| Rank0 | Write | 0/1 | 0/1 | 0/1 | X |
| Rank1 | Write | 0/1 | 0/1 | X | 0/1 |
| Rank2 | Write | 0/1 | X | 0/1 | 0/1 |
| Rank3 | Write | X | 0/1 | 0/1 | 0/1 |

In some examples, for Table III, each 0/1 in the "Ranks Which Terminate" may represent a bit in the first example lookup table. The bit may indicate whether to enable RTT or termination for this rank when the specified target rank (determined by Table II) is for a read command or for a write command. Also for Table III, an "X" indicates unused bits since a rank is not terminated or does not have a need for RTT when the rank is the specified target rank.

According to some examples, an ODT function based on the ODT encoding scheme shown in Table II may also include if both CS0 251 and CS1 252 are active for two consecutive clock cycles (e.g., each has received an input CS signal from the host computing device): the DIMM including memory device logic 300 is not the target of an access. For these examples, if memory device logic 300 is for an LRDIMM, no active CS signal will be outputted to memory devices at the DIMM. No active CS may reduce power usage due to no need for RTT/termination at the chip or device side of these memory devices as these memory devices are not being access or controlled. Also, buffers for the LRDIMM (e.g., LR buffers) will enable RTT_NOM_RD or RTT_NOM_WR depending or whether the received command via CA 254 is a read or write command.

In some examples, if the DIMM including memory logic 300 is an RDIMM (e.g., does not include host side buffers) and both CS0 251 and CS1 252 are active, a second lookup table may be used by logic and/or features at a register for the DIMM to determine which respective active CS will be outputted to cause respective ranks to terminate/RTT. An example second lookup table is shown in Table IV.

TABLE IV

| | | Ranks Which Terminate | | | |
|---|---|---|---|---|---|
| Target | Read/Write | 3 | 2 | 1 | 0 |
| Different DIMM | Read | 0/1 | 0/1 | 0/1 | 0/1 |
| Different DIMM | Write | 0/1 | 0/1 | 0/1 | 0/1 |

Similar to Table III, for Table IV, each 0/1 in the "Ranks Which Terminate" may represent a bit in the second example lookup table. The bit may indicate whether to enable RTT/termination on this rank when the command is for a read command or is for a write command. In some examples, Table III and IV may be combined into a single lookup table.

According to some examples, ODT encoding based on the ODT encoding scheme shown in Table II may also include both CS0 251 and CS1 252 not being active (e.g., not receiving input CS signals from the host computing device): the DIMM including memory device logic 300 does not decode the command and memory devices or buffers of the DIMM remain in RTT Park on the host side. For these examples, no active CS will be outputted at CS0 311, CS1 312, CS2 313 or CS3 314 from the register to memory devices of the DIMM.

In some examples, an additional mode may be added to a register including memory device logic 300 if the register is for a DIMM arranged as an RDIMM. For these examples, the additional mode could be provided for use with 2 channel RDIMMs where the chip select signals are passed straight through, with a host controller controlling DRAM chip select encodings directly.

It is noted that CKE encoding and ODT encoding schemes may use similar encodings via use of chip select signals, but for different purposes. Which scheme is used may be determined by a command received (e.g., through CA signals via CA 254) For example, read and write commands, including mode register set (MRS) read commands would use ODT encoding schemes. These read and write command may require bus RTT/termination and these types of commands likely would not be broadcasted to all ranks of a DIMM. Some types of commands may use CKE encoding schemes, but these commands may be limited to a specific set of commands (e.g., power down/up, self refresh, ZQ Cal).

Figure 4:
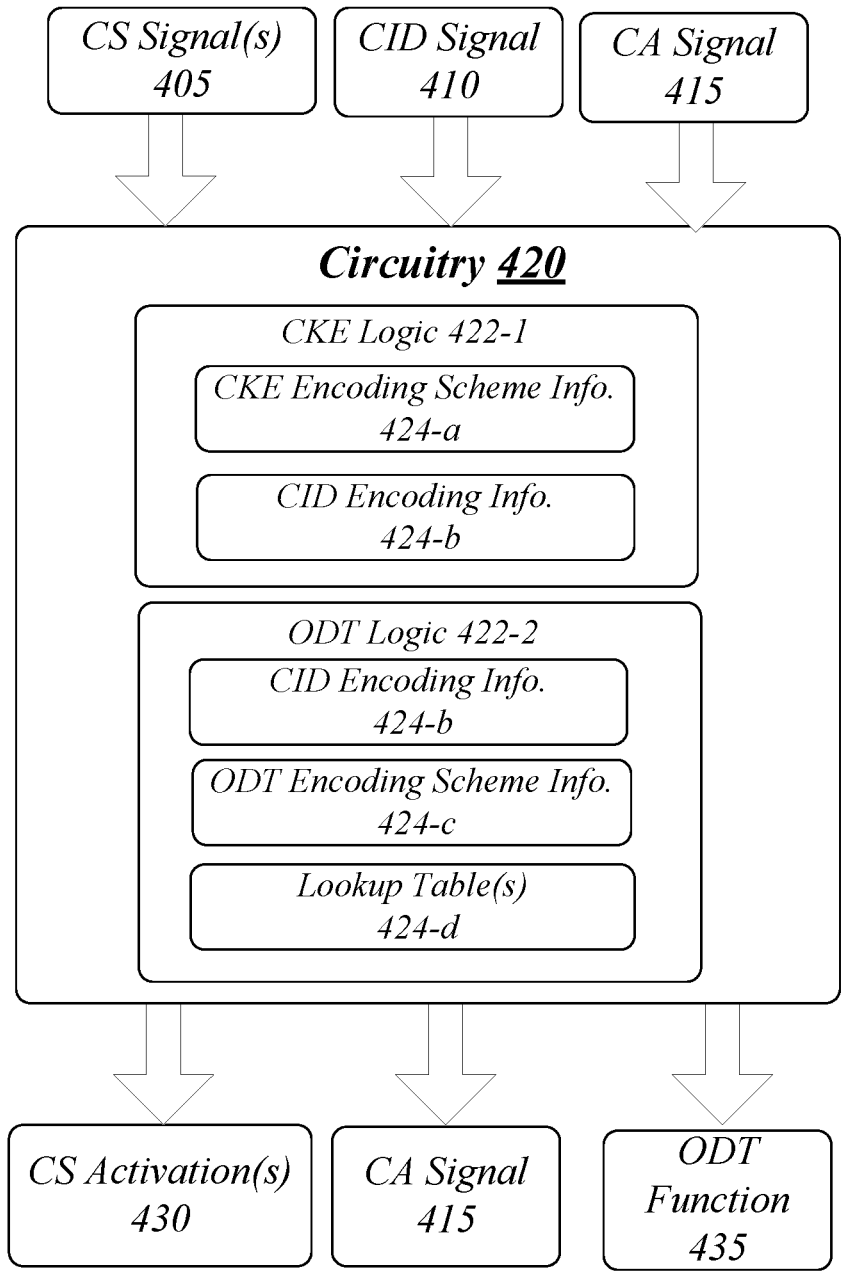
FIG. 4 illustrates an example apparatus.

FIG. 4 illustrates an example block diagram for an apparatus 400. Although apparatus 400 shown in FIG. 4 has a limited number of elements in a certain topology, it may be appreciated that the apparatus 400 may include more or less elements in alternate topologies as desired for a given implementation.

The apparatus 400 may be supported by circuitry 420 maintained or located at a DIMM coupled with a host computing device via one or more channels. Circuitry 420 may be arranged to execute one or more software or firmware implemented components or logic 422-*a*. It is worthy to note that "a" and "b" and "c" and similar designators as used herein are intended to be variables representing any positive integer. Thus, for example, if an implementation sets a value for a=2, then a complete set of software or firmware for components or logic 422-*a* may include components or logic 422-1 or 422-2. The examples presented are not limited in this context and the different variables used throughout may represent the same or different integer values. Also, these "components" or "logic" may be software/firmware stored in computer-readable media, and although the components are shown in FIG. 4 as discrete boxes, this does not limit these components to storage in distinct computer-readable media components (e.g., a separate memory, etc.).

According to some examples, circuitry 420 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 420 may also be an application specific integrated circuit (ASIC) and at least some components or logic 422-*a* may be implemented as hardware elements of the ASIC.

According to some examples, apparatus 400 may include a CKE logic 422-1. CKE logic 422-1 may be executed by circuitry 420 to use one or more active CSs, a CID signal or a CA signal received at a register of a DIMM including apparatus 400 to implement a CKE encoding scheme. The received one or more active CSs, the CID signal or the CA signal may be used to determine whether one or more respective active CSs are outputted from the register based on the CKE encoding scheme in order to control or access one or more respective ranks of memory devices of the DIMM. For these examples, the one or more active CSs may be included in CS signal(s) 405, the CID signal may be included in CID signal 410 and the CA signal may be included in CA signal 415. CS signal(s) 405, CID signal 410 and CA 415 signal may have been sent from a host controller. Based on the CKE encoding scheme, CS activation(s) 430 may cause one or more active CSs to be outputted from the register. Also, CA signal 415 may be forwarded to one or more ranks of memory devices being controlled or accessed responsive to which of the one or more CSs outputted from the register are caused to be activated due to CS activations(s) 430.

According to some examples, CKE encoding scheme information 424-*a* may be maintained by CKE logic 422-1 to implement the CKE encoding scheme and determine CS activations(s) 430 to control or activate the one or more respective ranks of memory devices based on the received one or more CS signal(s) 405, CID signal 410 or the CA signal 410. Also, CID encoding information 424-*b* may be maintained by or accessible to CKE logic 422-1 to determine CS activation(s) 430 to access or control a single rank for a received command or broadcast the received command to access or control all ranks of memory devices of the DIMM based on CID signal 410 and at least one of the active CSs included in CS signal(s) 405.

In some examples, apparatus 400 may also include an ODT logic 422-2. ODT logic 422-2 may be executed by circuitry 420 to use one or more active CSs, a CID signal or a CA signal received at the register of the DIMM including apparatus 400 to implement an ODT encoding scheme. The received one or more active CSs, the CID signal or the CA signal may be used to determine whether at least one active CS is outputted from the register to control or access at least one rank of memory devices of the DIMM and to determine which ODT functions are needed for all or at least some ranks of memory devices of the DIMM. For these examples, the one or more active CSs may be included in CS signal(s) 405, the CID signal may be included in CID signal 410 and the CA signal may be included in CA signal 415. As mentioned above, CS signal(s) 405, CID signal 410 and CA signal 415 may have been sent from a host controller. Based on the ODT encoding scheme, at least one CS activation(s) 430 may cause one or more active CSs to be outputted from the register. Also, what ODT function to be performed by targeted or non-targeted ranks may be indicated in ODT function 435 to at least some of the ranks of memory devices of the DIMM that includes apparatus 400.

According to some examples, CID encoding information 424-*b* may be maintained by or accessible to ODT logic 422-2 to determine CS activation(s) 430 to access or control a rank of memory devices of the DIMM including apparatus 400. Also, ODT encoding scheme information 424-*c* may be maintained by ODT logic 422-2 to implement the ODT encoding scheme and determine what ODT function to be performed by targeted or non-targeted ranks based on the received CS signal(s) 405, CID signal 410 or CA signal 410. Also, lookup table(s) 424-*d* may be maintained by ODT logic 422-2 to determine which ranks of memory devices of the DIMM are non-target ranks needing RTT or termination on a host side consistent with the determined ODT function. The lookup tables, for example, may be similar to Tables III and IV as mentioned above.

FIG. 5 illustrates an example logic flow 500. As shown in FIG. 5 the first logic flow includes a logic flow 500. Logic flow 500 may be representative of some or all of the operations executed by one or more logic, features, or devices described herein, such as apparatus 500. More particularly, logic flow 500 may be implemented by CKE logic 422-1 or ODT logic 422-2.

According to some examples, logic flow 500 at block 502 may receive, at a register for a DIMM, a command to access or control memory devices located at the DIMM or located at a second DIMM, the command received via a CA signal. For these examples, a register for the DIMM may include CKE logic 422-1 or ODT logic 422-2. The register may receive the command via a CA bus maintained with a host controller that sent the command.

In some examples, logic flow 500 at block 504 may determine whether one or more CSs received with the CA signal are active. For these examples, either CKE logic 422-1 or ODT logic 422-2 may determine which chip selects are active.

According to some examples, logic flow 500 at block 506 may determine whether to cause one or more CSs coupled between the register and memory devices at the DIMM to be activated and outputted from the register based on the determination of whether one or more CSs received with the CA signal are active and based on either a first encoding scheme for CKE functionality or based on a second encoding scheme for ODT functionality. For these examples, if a CKE encoding scheme is used, CKE logic 422-1 activates the one or more CSs coupled between the register and memory devices at the DIMM. If an ODT encoding scheme is used, ODT logic 422-2 activates the one or more CSs coupled between the register and memory devices at the DIMM.

FIG. 6 illustrates an example storage medium 600. As shown in FIG. 6, the first storage medium includes a storage medium 600. The storage medium 600 may comprise an article of manufacture. In some examples, storage medium 600 may include any non-transitory computer readable medium or machine readable medium, such as an optical, magnetic or semiconductor storage. Storage medium 600 may store various types of computer executable instructions, such as instructions to implement logic flow 500. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 7:
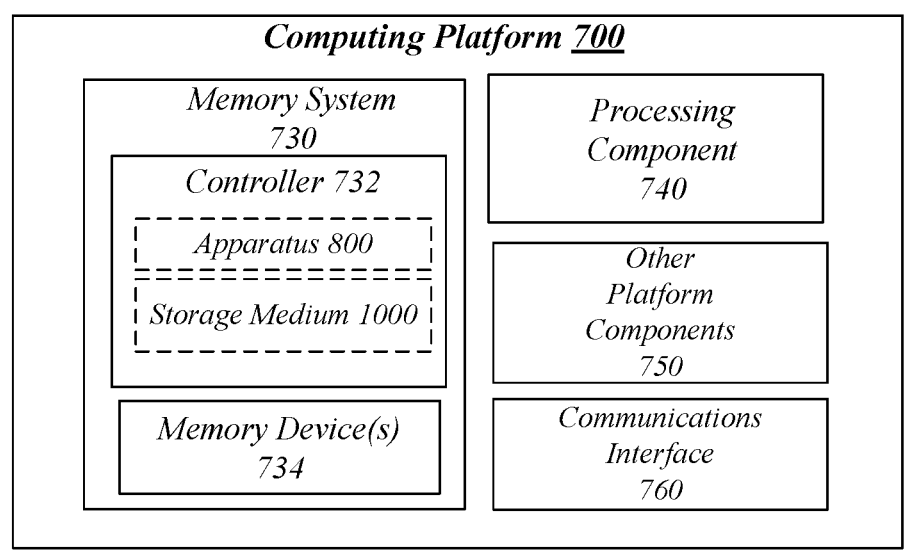
FIG. 7 illustrates an example computing platform.

FIG. 7 illustrates an example computing platform 700. In some examples, as shown in FIG. 7, computing platform 700 may include a memory system 730, a processing component 740, other platform components 750 or a communications interface 760. According to some examples, computing platform 700 may be implemented in a computing device.

According to some examples, memory system 730 may include a controller 732 and memory devices(s) 734. For these examples, logic and/or features resident at or located at controller 732 may execute at least some processing operations or logic for apparatus 400 and may include storage media that includes storage medium 600. Also, memory device(s) 734 may include similar types of volatile or non-volatile memory (not shown) that are described above for memory devices 122 or 222 shown in FIGS. 1 and 2. In some examples, controller 732 may be part of a same die with memory device(s) 734. In other examples, controller 732 and memory device(s) 734 may be located on a same die or integrated circuit with a processor (e.g., included in processing component 740). In yet other examples, controller 732 may be in a separate die or integrated circuit coupled with memory device(s) 734.

According to some examples, processing component 740 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 750 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 750 or storage system 730 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristors, STT-MRAM, magnetic or optical cards, and any other type of storage media suitable for storing information.

In some examples, communications interface 760 may include logic and/or features to support a communication interface. For these examples, communications interface 760 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 700 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 700 described herein, may be included or omitted in various embodiments of computing platform 700, as suitably desired.

The components and features of computing platform 700 may be implemented using any combination of discrete circuitry, ASICs, logic gates and/or single chip architectures. Further, the features of computing platform 700 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include a register at a DIMM that includes logic, at least a portion of which may include hardware, the logic may receive a command to access or control memory devices located at the DIMM or located at a second DIMM, the command received via a CA signal. The logic may also determine whether one or more CSs received with the CA signal are active. The logic may also determine whether to cause one or more CSs coupled between the register and memory devices at the DIMM to be activated and outputted from the register based on the determination of whether one or more CSs received with the CA signal are active and based on either a first encoding scheme for CKE functionality or based on a second encoding scheme for ODT functionality.

Example 2

The apparatus of example 1, the memory devices located at the DIMM may include the memory devices being arranged in multiple ranks. The one or more CSs coupled between the register may separately correspond to respective separate ranks from among the multiple ranks.

Example 3

The apparatus of example 2, the command to access or control the memory devices may be one of a self refresh entry command, a self refresh exit command, a power down entry command, a power down exit command or a ZQ calibration command.

Example 4

The apparatus of example 3, the one or more CSs received with the command may include a first CS received with the command or a second CS received with the command, wherein the logic to determine whether to cause one or more CSs coupled between the register and the memory devices at the DIMM to be activated and outputted from the register based on one of the first or second CSs received with the command is determined as active and based on the first encoding scheme for CKE functionality.

Example 5

The apparatus of example 4, the multiple ranks may include four ranks. The one or more CSs coupled between the register and the memory devices may include first, second, third and fourth CSs to be outputted from the register to respective first, second, third and fourth ranks. For this example, the apparatus may also include the logic to determine a state of a CID bit received with the command indicates a value of 0 or a value of 1. The logic may also cause a respective CS from among the first, second, third or fourth CSs to be activated to cause the command to be routed to a respective rank from among the first, second, third or fourth ranks is based on the state of the CID bit and is based on the one of the first or second CSs received with the command also determined as active.

Example 6

The apparatus of example 3, the one or more CSs received with the command may include a first CS or a second CS. For this example, the logic to determine whether to cause one or more CSs coupled between the register and the memory devices at the DIMM to be activated and outputted from the register may be based on both the first and second CSs received with the command being determined as active and may also be based on the first encoding scheme for CKE functionality.

Example 7

The apparatus of example 6, the multiple ranks may include four ranks. The one or more CSs coupled between the register and the memory devices may include first, second, third and fourth CSs to be outputted from the register to respective first, second, third and fourth ranks. For this example the apparatus may also include the logic to cause all CSs from among the first, second, third or fourth CSs to be activated to cause the command to be routed to all ranks from among the first, second, third or fourth ranks based on both the first and second CSs received with the command being determined as active.

Example 8

The apparatus of example 2, the command to access or control the memory devices may be one of a read command or a write command.

Example 9

The apparatus of example 8, the one or more CSs received with the command may include a first CS received with the command or a second CS received with the command. For this example, the logic may determine whether to cause one or more CSs coupled between the register and the memory devices at the DIMM to be activated and outputted from the register is based on one of the first or second CSs received with the command being determined as active for a first clock cycle and not active for a second clock cycle, and also based on the second encoding scheme for ODT functionality.

Example 10

The apparatus of example 9, the multiple ranks may include four ranks. The one or more CSs coupled between the register and the memory devices may include first, second, third and fourth CSs to be outputted from the register to respective first, second, third and fourth ranks. For this example, the apparatus may also include the logic to determine a state of a CID received with the command indicates a value of 0 or a value of 1. The logic may also cause a respective CS from among the first, second, third or fourth CSs to be activated to cause the command to be routed to a respective rank from among the first, second, third or fourth ranks based on the state of the CID bit and also based on the one of the first or second CSs received with the command being determined as active for a first clock cycle and not active for a second clock cycle.

Example 11

The apparatus of example 10, the logic may also determine which of the first, second, third or fourth ranks is not a target of the command. The logic may also use a lookup table to determine which of the first, second, third and fourth CSs to be outputted from the register are activated to cause respective first, second, third and fourth ranks to have RTTs when these ranks are determined as not the target of the command. The RTTs may include one of RTT_NOM_RD when the command is a read command or RTT_NOM_WR when the command is a write command.

Example 12

The apparatus of example 8, the one or more CSs received with the command may include a first CS received with the command or a second CS received with the command, wherein determining whether to cause one or more CSs coupled between the register and the memory devices at the DIMM to be activated and outputted from the register may be based on the first and second CSs received with the command determined to be active for two consecutive command cycles and may also be based on the second encoding scheme for ODT functionality.

Example 13

The apparatus of example 12, the DIMM may be a load reduced DIMM (LRDIMM). For this example, the apparatus may also include the logic to cause no CS from among the one or more CSs coupled between the register and the memory devices at the LRDIMM to be activated. The logic may also cause each buffer on a host side of a data bus coupled with the LRDIMM to have RTTs, the RTTs to include one of RTT_NOM_RD when the command is a read command or RTT_NOM_WR when the command is a write command.

Example 14

The apparatus of example 12, the multiple ranks may include four ranks. The one or more CSs coupled between the register and the memory devices may include first, second, third and fourth CSs to be outputted from the register to respective first, second, third and fourth ranks. The DIMM may be arranged as an RDIMM. For this example, the apparatus may also include the logic to use a lookup table to determine which of the first, second, third and fourth CSs to be outputted from the register are activated to cause respective first, second, third and fourth ranks to have RTTs, the RTTs to include one of RTT_NOM_RD when the command is a read command or RTT_NOM_WR when the command is a write command.

Example 15

The apparatus of example 1, the memory devices may include non-volatile memory or volatile memory.

Example 16

The apparatus of example 15, the volatile memory may include DRAM.

Example 17

The apparatus of example 15, the non-volatile memory may be 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM, memory that incorporates memristor technology or STT-MRAM.

Example, 18

The apparatus of example 1, the DIMM may be an RDIMM or an LRDIMM.

Example 19

An example method may include receiving, at a register for a DIMM, a command to access or control memory devices located at the DIMM or located at a second DIMM, the command received via a CA signal. The method may also include determining whether one or more CSs received with the CA signal are active. The method may also include determining whether to cause one or more CSs coupled between the register and memory devices at the DIMM to be activated and outputted from the register based on the determination of whether one or more CSs received with the CA signal are active and based on either a first encoding scheme for CKE functionality or based on a second encoding scheme for ODT functionality.

Example 20

The method of example 19, the memory devices located at the DIMM may include the memory devices arranged in multiple ranks. The one or more CSs may be coupled between the register separately corresponding to respective separate ranks from among the multiple ranks.

Example 21

The method of example 20, the command to access or control the memory devices may include one of a self refresh entry command, a self refresh exit command, a power down entry command, a power down exit command or a ZQ calibration command.

Example 22

The method of example 21, the one or more CSs received with the command may include a first CS received with the command or a second CS received with the command. For this example, determining whether to cause one or more CSs coupled between the register and the memory devices at the DIMM to be activated and outputted from the register may be based on one of the first or second CSs received with the command being determined as active and may also be based on the first encoding scheme for CKE functionality.

Example 23

The method of example 22, the multiple ranks may include four ranks. The one or more CSs coupled between the register and the memory devices may include first, second, third and fourth CSs to be outputted from the register to respective first, second, third and fourth ranks. For this example, the method may also include determining a state of a CID bit received with the command indicates a value of 0 or a value of 1. The method may also include activating a respective CS from among the first, second, third or fourth CSs to cause the command to be routed to a respective rank from among the first, second, third or fourth ranks based on the state of the CID bit and based on the one of the first or second CSs received with the command being determined as active.

Example 24

The method of example 21, the one or more CSs received with the command may include a first CS or a second CS. For this example, determining whether to cause one or more CSs coupled between the register and the memory devices at the DIMM to be activated and outputted from the register may be based on both the first and second CSs received with the command being determined as active and may also be based on the first encoding scheme for CKE functionality.

Example 25

The method of example 24, the multiple ranks may include four ranks. The one or more CSs coupled between the register and the memory devices may include first, second, third and fourth CSs to be outputted from the register to respective first, second, third and fourth ranks. For these examples, the method may also include activating all CSs from among the first, second, third or fourth CSs to cause the command to be routed to all ranks from among the first, second, third or fourth ranks based on both the first and second CSs received with the command being determined as active.

Example 26

The method of example 20, the command to access or control the memory devices may be one of a read command or a write command.

Example 27

The method of example 26, the one or more CSs received with the command may include a first CS received with the command or a second CS received with the command. For this example, determining whether to cause one or more CSs coupled between the register and the memory devices at the DIMM to be activated and outputted from the register may be based on one of the first or second CSs received with the command being determined as active for a first clock cycle and not active for a second clock cycle, and may also be based on the second encoding scheme for ODT functionality.

Example 28

The method of example 27, the multiple ranks may include four ranks. The one or more CSs coupled between the register and the memory devices may include first, second, third and fourth CSs to be outputted from the register to respective first, second, third and fourth ranks. For this example, the method may also include determining a state of a CID received with the command indicates a value of 0 or a value of 1. The method may also include activating a respective CS from among the first, second, third or fourth CSs to cause the command to be routed to a respective rank from among the first, second, third or fourth ranks based on the state of the CID bit and based on the one of the first or second CSs received with the command being determined as active for a first clock cycle and not active for a second clock cycle.

Example 29

The method of example 28 may also include determining which of the first, second, third or fourth ranks is not a target of the command. The method may also include using a lookup table to determine which of the first, second, third and fourth CSs to be outputted from the register are activated to cause respective first, second, third and fourth ranks to have RTTs when these ranks are determined as not the target of the command. The RTTs may include one of RTT_NOM_RD when the command is a read command or RTT_NOM_WR when the command is a write command.

Example 30

The method of example 26, the one or more CSs received with the command may include a first CS received with the command or a second CS received with the command, wherein determining whether to cause one or more CSs coupled between the register and the memory devices at the DIMM to be activated and outputted from the register is based on the first and second CSs received with the command being determined as active for two consecutive command cycles and based on the second encoding scheme for ODT functionality.

Example 31

The method of example 30, the DIMM may be an LRDIMM. For this example, the method may also include causing no CS from among the one or more CSs coupled between the register and the memory devices at the LRDIMM to be activated. The method may also include causing each buffer on a host side of a data bus coupled with the LRDIMM to have RTTs. The RTTs may include one of RTT_NOM_RD when the command is a read command or RTT_NOM_WR when the command is a write command.

Example 32

The method of example 30, the multiple ranks may include four ranks. The one or more CSs coupled between the register and the memory devices may include first, second, third and fourth CSs to be outputted from the register to respective first, second, third and fourth ranks. The DIMM may be arranged as an RDIMM. For this example, the method may also include using a lookup table to determine which of the first, second, third and fourth CSs to be outputted from the register are activated to cause respective first, second, third and fourth ranks to have RTTs. The RTTs may include one of RTT_NOM_RD when the command is a read command or RTT_NOM_WR when the command is a write command.

Example 33

The method of example 19, the memory devices may include non-volatile memory or volatile memory.

Example 34

The method of example 33, the volatile memory may be DRAM.

Example 35

The method of example 33, the non-volatile memory comprising 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM, memory that incorporates memristor technology or STT-MRAM.

Example 36

The method of example 19, the DIMM may be an RDIMM or an LRDIMM.

Example 37

At least one machine readable medium may include a plurality of instructions that in response to being executed by a system may cause the system to carry out a method according to any one of examples 19 to 36.

Example 38

An apparatus may include means for performing the methods of any one of examples 19 to 36.

Example 39

An example system may include a DIMM and a plurality of memory devices on the DIMM. The system may also include a register on the DIMM coupled with the plurality of memory devices. The register may include logic, at least a portion of which comprises hardware, the logic may receive a command to access or control at least some of the plurality of memory devices located at the DIMM or a second plurality of memory devices located at a second DIMM, the command received via a CA signal. The logic may also determine whether one or more CSs received with the CA signal are active. The logic may also determine whether to cause one or more CSs coupled between the register and the plurality of memory devices at the DIMM to be activated and outputted from the register based on the determination of whether one or more CSs received with the CA signal are active and based on either a first encoding scheme for CKE functionality or based on a second encoding scheme for ODT functionality.

Example 40

The system of example 39, the plurality of memory devices located at the DIMM may include the plurality of memory devices being arranged in multiple ranks. The one or more CSs coupled between the register may separately correspond to respective separate ranks from among the multiple ranks.

Example 41

The system of example 40, the command to access or control at least some of the plurality of memory devices may include one of a self refresh entry command, a self refresh exit command, a power down entry command, a power down exit command or a ZQ calibration command.

Example 42

The system of example 41, the one or more CSs received with the command may include a first CS received with the command or a second CS received with the command. For this example, the logic to determine whether to cause one or more CSs coupled between the register and the plurality of memory devices at the DIMM to be activated and outputted from the register may be based on one of the first or second CSs received with the command is determined as active and may also be based on the first encoding scheme for CKE functionality.

Example 43

The system of example 42, the multiple ranks may include four ranks. The one or more CSs coupled between the register and the plurality of memory devices may include first, second, third and fourth CSs to be outputted from the register to respective first, second, third and fourth ranks. For this example, the system may also include the logic to determine a state of a CID received with the command indicates a value of 0 or a value of 1. The logic may to cause a respective CS from among the first, second, third or fourth CSs to be activated to cause the command to be routed to a respective rank from among the first, second, third or fourth ranks may be based on the state of the CID and may also be based on the one of the first or second CSs received with the command also determined as active.

Example 44

The system of example 41, the one or more CSs received with the command may include a first CS or a second CS. For this example, the logic to determine whether to cause one or more CSs coupled between the register and the plurality of memory devices at the DIMM to be activated and outputted from the register may be based on both the first and second CSs received with the command being determined as active and may also be based on the first encoding scheme for CKE functionality.

Example 45

The system of example 44, the multiple ranks may include four ranks. The one or more CSs coupled between the register and the plurality memory devices may include first, second, third and fourth CSs to be outputted from the register to respective first, second, third and fourth ranks. For this example, the system may also include the logic to cause all CSs from among the first, second, third or fourth CSs to be activated to cause the command to be routed to all ranks from among the first, second, third or fourth ranks based on both the first and second CSs received with the command being determined as active.

Example 46

The system of example 40, the command to access or control at least some of the plurality of memory devices may include one of a read command or a write command.

Example 47

The system of example 46, the one or more CSs received with the command may include a first CS received with the command or a second CS received with the command. For this example, the logic may determine whether to cause one or more CSs coupled between the register and the plurality of memory devices at the DIMM to be activated and outputted from the register based on one of the first or second CSs received with the command being determined as active for a first clock cycle and not active for a second clock cycle, and based on the second encoding scheme for ODT functionality.

Example 48

The system of example 47, the multiple ranks may include four ranks. The one or more CSs coupled between the register and the plurality of memory devices may include first, second, third and fourth CSs to be outputted from the register to respective first, second, third and fourth ranks. For this example, the system may also include the logic to determine a state of a CID received with the command indicates a value of 0 or a value of 1. The logic may also cause a respective CS from among the first, second, third or fourth CSs to be activated to cause the command to be routed to a respective rank from among the first, second, third or fourth ranks based on the state of the CID bit and based on the one of the first or second CSs received with the command being determined as active for a first clock cycle and not active for a second clock cycle.

Example 49

The system of example 48, the logic may also determine which of the first, second, third or fourth ranks is not a target of the command. The logic may also use a lookup table to determine which of the first, second, third and fourth CSs to be outputted from the register are activated to cause respective first, second, third and fourth ranks to have RTTs when these ranks are determined as not the target of the command. The RTTs may include one of RTT_NOM_RD when the command is a read command or RTT_NOM_WR when the command is a write command.

Example 50

The system of example 46, the one or more CSs received with the command may include a first CS received with the command or a second CS received with the command. For this example, determining whether to cause one or more CSs coupled between the register and the plurality of memory devices at the DIMM to be activated and outputted from the register may be based on the first and second CSs received with the command determined to be active for two consecutive command cycles and may also be based on the second encoding scheme for ODT functionality.

Example 51

The system of example 50, the DIMM may include an LRDIMM. For this example, the system may also include the logic to cause no CS from among the one or more CSs coupled between the register and the plurality of memory devices at the LRDIMM to be activated. The logic may also cause each buffer on a host side of a data bus coupled with the LRDIMM to have RTTs. The RTTs may include one of RTT_NOM_RD when the command is a read command or RTT_NOM_WR when the command is a write command.

Example 52

The system of example 50, the multiple ranks may include four ranks. The one or more CSs coupled between the register and the plurality of memory devices may include first, second, third and fourth CSs to be outputted from the register to respective first, second, third and fourth ranks. The DIMM may arranged as an RDIMM. For this example, the system may also include the logic to use a lookup table to determine which of the first, second, third and fourth CSs to be outputted from the register are activated to cause respective first, second, third and fourth ranks to have RTTs. The RTTs may include one of RTT_NOM_RD when the command is a read command or RTT_NOM_WR when the command is a write command.

Example 53

The system of example 39, the plurality of memory devices may include non-volatile memory or volatile memory.

Example 54

The system of example 53, the volatile memory may be DRAM.

Example 55

The system of example 53, the non-volatile memory may include 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM, memory that incorporates memristor technology or STT-MRAM.

Example 56

The system of example 39, the DIMM may include an RDIMM or an LRDIMM.

Example 57

The system of example 39, may also include a host computing device coupled with the DIMM. The system may also include one or more of a network interface communicatively coupled to the host computing device, a battery coupled to the host computing device or a display communicatively coupled to the host computing device.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first, " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. An apparatus comprising:
   a register at a dual-in-line memory module (DIMM) that includes logic, at least a portion of which comprises hardware, the logic to:
      receive a command to access or control memory devices located at the DIMM or located at a second DIMM, the command received via a command/address (CA) signal;
      determine whether one or more chip selects (CSs) received with the CA signal are active; and
      determine whether to cause one or more CSs coupled between the register and memory devices at the DIMM to be activated and outputted from the register based on the determination of whether one or more CSs received with the CA signal are active and based on either a first encoding scheme for clock enable (CKE) functionality or based on a second encoding scheme for on-die termination (ODT) functionality, the first encoding scheme to include use of a state of a chip identification (CID) bit received with the command to determine whether to cause the one or more CSs coupled between the register and memory devices to be active and outputted from the register.

2. The apparatus of claim 1, the memory devices located at the DIMM comprises the memory devices arranged in multiple ranks, the one or more CSs coupled between the register separately to correspond to respective separate ranks from among the multiple ranks.

3. The apparatus of claim 2, the command to access or control the memory devices comprises one of a self refresh entry command, a self refresh exit command, a power down entry command, a power down exit command or a ZQ calibration command.

4. The apparatus of claim 3, the one or more CSs received with the command comprises a first CS received with the command or a second CS received with the command, wherein the logic to determine whether to cause one or more CSs coupled between the register and the memory devices at the DIMM to be activated and outputted from the register based on one of the first or second CSs received with the command is determined as active and based on the first encoding scheme for CKE functionality.

5. The apparatus of claim 4, comprising the multiple ranks to include four ranks, the one or more CSs coupled between the register and the memory devices including first, second, third and fourth CSs to be outputted from the register to respective first, second, third and fourth ranks, the apparatus further comprising the logic to:
determine whether the state of the CID bit received with the command indicates a value of 0 or a value of 1; and
cause a respective CS from among the first, second, third or fourth CSs to be activated to cause the command to be routed to a respective rank from among the first, second, third or fourth ranks is based on the state of the CID bit and is based on the one of the first or second CSs received with the command also determined as active.

6. The apparatus of claim 3, the one or more CSs received with the command comprises a first CS or a second CS, wherein the logic to determine whether to cause one or more CSs coupled between the register and the memory devices at the DIMM to be activated and outputted from the register based on both the first and second CSs received with the command is determined as active and based on the first encoding scheme for CKE functionality.

7. The apparatus of claim 6, comprising the multiple ranks to include four ranks, the one or more CSs coupled between the register and the memory devices including first, second, third and fourth CSs to be outputted from the register to respective first, second, third and fourth ranks, the apparatus further comprising the logic to:
cause all CSs from among the first, second, third or fourth CSs to be activated to cause the command to be routed to all ranks from among the first, second, third or fourth ranks based on both the first and second CSs received with the command being determined as active.

8. The apparatus of claim 2, the command to access or control the memory devices comprises one of a read command or a write command.

9. The apparatus of claim 8, the one or more CSs received with the command comprises a first CS received with the command or a second CS received with the command, wherein the logic to determine whether to cause one or more CSs coupled between the register and the memory devices at the DIMM to be activated and outputted from the register is based on one of the first or second CSs received with the command being determined as active for a first clock cycle and not active for a second clock cycle, and based on the second encoding scheme for ODT functionality.

10. The apparatus of claim 9, comprising the multiple ranks to include four ranks, the one or more CSs coupled between the register and the memory devices to include first, second, third and fourth CSs to be outputted from the register to respective first, second, third and fourth ranks, the apparatus further comprising the logic to:
determine whether the state of the CID bit received with the command indicates a value of 0 or a value of 1; and
cause a respective CS from among the first, second, third or fourth CSs to be activated to cause the command to be routed to a respective rank from among the first, second, third or fourth ranks based on the state of the CID bit and based on the one of the first or second CSs received with the command being determined as active for a first clock cycle and not active for a second clock cycle.

11. The apparatus of claim 10, comprising the logic to:
determine which of the first, second, third or fourth ranks is not a target of the command; and
use a lookup table to determine which of the first, second, third and fourth CSs to be outputted from the register are activated to cause respective first, second, third and fourth ranks to have internal resistance terminations (RTTs) when these ranks are determined as not the target of the command, the RTTs to include one of RTT_NOM_RD when the command is a read command or RTT_NOM_WR when the command is a write command.

12. The apparatus of claim 8, the one or more CSs received with the command comprises a first CS received with the command or a second CS received with the command, wherein determining whether to cause one or more CSs coupled between the register and the memory devices at the DIMM to be activated and outputted from the register is based on the first and second CSs received with the command determined to be active for two consecutive command cycles and based on the second encoding scheme for ODT functionality.

13. The apparatus of claim 12, the DIMM comprises a load reduced DIMM (LRDIMM), the apparatus further comprising the logic to:
cause no CS from among the one or more CSs coupled between the register and the memory devices at the LRDIMM to be activated; and
cause each buffer on a host side of a data bus coupled with the LRDIMM to have internal resistance terminations (RTTs), the RTTs to include one of RTT_NOM_RD when the command is a read command or RTT_NOM_WR when the command is a write command.

14. The apparatus of claim 12, comprising the multiple ranks to include four ranks, the one or more CSs coupled between the register and the memory devices to include first, second, third and fourth CSs to be outputted from the register to respective first, second, third and fourth ranks, the DIMM is arranged as a registered DIMM (RDIMM), the apparatus further comprising the logic to:

use a lookup table to determine which of the first, second, third and fourth CSs to be outputted from the register are activated to cause respective first, second, third and fourth ranks to have internal resistance terminations (RTTs), the RTTs to include one of RTT_NOM_RD when the command is a read command or RTT_NOM_WR when the command is a write command.

15. The apparatus of claim 1, comprising the memory devices to include non-volatile memory or volatile memory, wherein the volatile memory includes dynamic random access memory (DRAM), the non-volatile memory includes 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM), memory that incorporates memristor technology or spin transfer torque MRAM (STT-MRAM).

16. A method comprising:
receiving, at a register for a dual-in-line memory module (DIMM), a command to access or control memory devices located at the DIMM or located at a second DIMM, the command received via a command/address (CA) signal;
determining whether one or more chip selects (CSs) received with the CA signal are active; and
determining whether to cause one or more CSs coupled between the register and memory devices at the DIMM to be activated and outputted from the register based on the determination of whether one or more CSs received with the CA signal are active and based on either a first encoding scheme for clock enable (CKE) functionality or based on a second encoding scheme for on-die termination (ODT) functionality, the first encoding scheme to include use of a state of a chip identification (CID) bit received with the command to determine whether to cause the one or more CSs coupled between the register and memory devices to be active and outputted from the register.

17. The method of claim 16, the memory devices located at the DIMM comprises the memory devices arranged in multiple ranks, the one or more CSs coupled between the register separately corresponding to respective separate ranks from among the multiple ranks,
the command to access or control the memory devices comprises one of a self refresh entry command, a self refresh exit command, a power down entry command, a power down exit command or a ZQ calibration command.

18. The method of claim 17, the one or more CSs received with the command comprises a first CS received with the command or a second CS received with the command, wherein determining whether to cause one or more CSs coupled between the register and the memory devices at the DIMM to be activated and outputted from the register is based on one of the first or second CSs received with the command being determined as active and based on the first encoding scheme for CKE functionality.

19. The method of claim 18, comprising the multiple ranks including four ranks, the one or more CSs coupled between the register and the memory devices including first, second, third and fourth CSs to be outputted from the register to respective first, second, third and fourth ranks, the method further comprising:
determining whether the state of the CID bit received with the command indicates a value of 0 or a value of 1; and
activating a respective CS from among the first, second, third or fourth CSs to cause the command to be routed to a respective rank from among the first, second, third or fourth ranks based on the state of the CID bit and based on the one of the first or second CSs received with the command being determined as active.

20. The method of claim 17, the one or more CSs received with the command comprises a first CS or a second CS, wherein determining whether to cause one or more CSs coupled between the register and the memory devices at the DIMM to be activated and outputted from the register is based on both the first and second CSs received with the command being determined as active and based on the first encoding scheme for CKE functionality.

21. The method of claim 20, comprising the multiple ranks including four ranks, the one or more CSs coupled between the register and the memory devices including first, second, third and fourth CSs to be outputted from the register to respective first, second, third and fourth ranks, the method further comprising:
activating all CSs from among the first, second, third or fourth CSs to cause the command to be routed to all ranks from among the first, second, third or fourth ranks based on both the first and second CSs received with the command being determined as active.

22. A system comprising:
a dual-in-line memory module (DIMM);
a plurality of memory devices on the DIMM;
a register on the DIMM coupled with the plurality of memory devices, the register includes logic, at least a portion of which comprises hardware, the logic to:
receive a command to access or control at least some of the plurality of memory devices located at the DIMM or a second plurality of memory devices located at a second DIMM, the command received via a command/address (CA) signal;
determine whether one or more chip selects (CSs) received with the CA signal are active; and
determine whether to cause one or more CSs coupled between the register and the plurality of memory devices at the DIMM to be activated and outputted from the register based on the determination of whether one or more CSs received with the CA signal are active and based on either a first encoding scheme for clock enable (CKE) functionality or based on a second encoding scheme for on-die termination (ODT) functionality, the first encoding scheme to include use of a state of a chip identification (CID) bit received with the command to determine whether to cause the one or more CSs coupled between the register and memory devices to be active and outputted from the register.

23. The system of claim 22, the plurality of memory devices located at the DIMM comprises the plurality of memory devices arranged in multiple ranks, the one or more CSs coupled between the register separately to correspond to respective separate ranks from among the multiple ranks, the command to access or control at least some of the plurality of memory devices comprises one of a self refresh entry command, a self refresh exit command, a power down entry command, a power down exit command or a ZQ calibration command.

24. The system of claim 23, the one or more CSs received with the command comprises a first CS received with the command or a second CS received with the command, wherein the logic to determine whether to cause one or more CSs coupled between the register and the plurality of memory devices at the DIMM to be activated and outputted from the register based on one of the first or second CSs received with the command is determined as active and based on the first encoding scheme for CKE functionality.

25. The system of claim 24, comprising the multiple ranks to include four ranks, the one or more CSs coupled between the register and the plurality of memory devices to include first, second, third and fourth CSs to be outputted from the register to respective first, second, third and fourth ranks, the system further comprising the logic to:
determine whether the state of the CID bit received with the command indicates a value of 0 or a value of 1; and
cause a respective CS from among the first, second, third or fourth CSs to be activated to cause the command to be routed to a respective rank from among the first, second, third or fourth ranks is based on the state of the CID and is based on the one of the first or second CSs received with the command also determined as active.

26. The system of claim 23, the one or more CSs received with the command comprises a first CS or a second CS, wherein the logic to determine whether to cause one or more CSs coupled between the register and the plurality of memory devices at the DIMM to be activated and outputted from the register based on both the first and second CSs received with the command is determined as active and based on the first encoding scheme for CKE functionality.

27. The system of claim 26, comprising the multiple ranks to include four ranks, the one or more CSs coupled between the register and the plurality memory devices including first, second, third and fourth CSs to be outputted from the register to respective first, second, third and fourth ranks, the system further comprising the logic to:
cause all CSs from among the first, second, third or fourth CSs to be activated to cause the command to be routed to all ranks from among the first, second, third or fourth ranks based on both the first and second CSs received with the command being determined as active.

28. The system of claim 22, further comprising:
a host computing device coupled with the DIMM; and
one or more or more of:
a network interface communicatively coupled to the host computing device;
a battery coupled to the host computing device; or
a display communicatively coupled to the host computing device.

* * * * *